(12) United States Patent
Yu et al.

(10) Patent No.: US 10,459,724 B2
(45) Date of Patent: Oct. 29, 2019

(54) MEMORY DEVICE, AND DATA PROCESSING METHOD BASED ON MULTI-LAYER RRAM CROSSBAR ARRAY

(71) Applicants: HUAWEI TECHNOLOGIES CO., LTD., Shenzhen, Guangdong (CN); NANYANG TECHNOLOGICAL UNIVERSITY, Singapore (SG)

(72) Inventors: Hao Yu, Singapore (SG); Yuhao Wang, Singapore (SG); Junfeng Zhao, Shenzhen (CN); Wei Yang, Hangzhou (CN); Shihai Xiao, Moscow (RU); Leibin Ni, Singapore (SG)

(73) Assignees: HUAWEI TECHNOLOGIES CO., LTD., Shenzhen (CN); NANYANG TECHNOLOGICAL UNIVERSITY, Singapore (SG)

( * ) Notice: Subject to any disclaimer, the term of this patent is extended or adjusted under 35 U.S.C. 154(b) by 0 days.

(21) Appl. No.: 16/037,767

(22) Filed: Jul. 17, 2018

(65) Prior Publication Data
US 2018/0321942 A1    Nov. 8, 2018

Related U.S. Application Data

(63) Continuation of application No. PCT/CN2016/071254, filed on Jan. 18, 2016.

(51) Int. Cl.
*G06F 9/30* (2018.01)
*G06F 17/16* (2006.01)
(Continued)

(52) U.S. Cl.
CPC ............ *G06F 9/30036* (2013.01); *G06F 7/00* (2013.01); *G06F 9/3001* (2013.01);
(Continued)

(58) Field of Classification Search
USPC .......................................................... 708/835
See application file for complete search history.

(56) References Cited

U.S. PATENT DOCUMENTS

| 5,787,310 A | 7/1998 | Shimizu et al. |
| 7,835,174 B2 | 11/2010 | Tokiwa |

(Continued)

FOREIGN PATENT DOCUMENTS

| CN | 1138719 A | 12/1996 |
| CN | 101840995 A | 9/2010 |

(Continued)

OTHER PUBLICATIONS

Yixing Li et al, A 7.663-TOPS 8.2-W Energy-efficient FPGA Accelerator for Binary Convolutional Neural Networks. Proceeding FPGA 17 Proceedings of the 2017 ACM/SIGDA International Symposium on Field-Programmable Gate Arrays, Monterey, California, USA—Feb. 22-24, 2017 , 8 pages.

(Continued)

*Primary Examiner* — Tan V Mai
(74) *Attorney, Agent, or Firm* — Huawei Technologies Co., Ltd.

(57) ABSTRACT

Embodiments of the present disclosure provide a memory device. The memory device includes an RRAM crossbar array that is configured to perform a logic operation, and resistance values of resistors in the RRAM crossbar array are all set to $R_{on}$ or $R_{off}$ to indicate a value 1 or 0. Based on the foregoing setting, an operation is implemented using the RRAM crossbar array, so that reliability of a logic operation of the RRAM crossbar array can be improved.

20 Claims, 6 Drawing Sheets

(51) Int. Cl.

| | | |
|---|---|---|
| *G11C 13/00* | (2006.01) | |
| *G11C 7/10* | (2006.01) | |
| *G11C 5/02* | (2006.01) | |
| *G06F 7/00* | (2006.01) | |
| *G06F 13/00* | (2006.01) | |
| *G06N 3/063* | (2006.01) | |
| *G06J 1/00* | (2006.01) | |

(52) U.S. Cl.
CPC .......... *G06F 9/30025* (2013.01); *G06F 13/00* (2013.01); *G06F 17/16* (2013.01); *G06J 1/00* (2013.01); *G06N 3/0635* (2013.01); *G11C 5/02* (2013.01); *G11C 7/1006* (2013.01); *G11C 13/003* (2013.01); *G11C 13/004* (2013.01); *G11C 13/0023* (2013.01); *G11C 2213/71* (2013.01); *G11C 2213/77* (2013.01)

(56) References Cited

U.S. PATENT DOCUMENTS

| | | | |
|---|---|---|---|
| 2010/0046275 A1 | 2/2010 | Hosono et al. | |
| 2010/0178729 A1 | 7/2010 | Yoon et al. | |
| 2014/0133211 A1* | 5/2014 | Nazarian | G11C 7/062 365/145 |
| 2014/0172937 A1* | 6/2014 | Linderman | G06G 7/16 708/607 |
| 2015/0012694 A1* | 1/2015 | Edelhaeuser | G11C 11/005 711/104 |
| 2015/0186258 A1* | 7/2015 | Edelhaeuser | G06F 12/0246 711/103 |
| 2015/0213884 A1* | 7/2015 | Taha | G11C 13/004 365/148 |
| 2015/0236697 A1 | 8/2015 | Miao et al. | |
| 2016/0020766 A1 | 1/2016 | Miao et al. | |

FOREIGN PATENT DOCUMENTS

| | | |
|---|---|---|
| CN | 102169720 A | 8/2011 |
| CN | 102412827 A | 4/2012 |
| CN | 104124960 A | 10/2014 |
| CN | 104240753 A | 12/2014 |
| CN | 103716038 B | 5/2016 |
| EP | 2814036 A2 | 12/2014 |
| JP | H03268077 A | 11/1991 |
| JP | 2014081842 A | 5/2014 |
| WO | 2011133139 A1 | 10/2011 |
| WO | 2014109771 A1 | 7/2014 |
| WO | 2016064406 A1 | 4/2016 |

OTHER PUBLICATIONS

Leibin Ni et al, Distributed In-Memory Computing on Binary RRAM Crossbar. ASP-DAC'16, ACM Journal on Emerging Technologies in Computing Systems, vol. 0, No. 0, Article 0, Pub. date: Jan. 2010. 18 pages.

Yu-Hsin Chen et al, Eyeriss: An Energy-Efficient Reconfigurable Accelerator for Deep Convolutional Neural Networks. IEEE Journal of Solid-State Circuits, vol. 52, No. 1, Jan. 2017, 12 pages.

Shoun Matsunaga et al, MTJ-Based Nonvolatile Logic-in-Memory Circuit, Future Prospects and Issues. 2009 Design, Automation and Test in Europe Conference and Exhibition, Jun. 23, 2009, 3 pages.

Sing Chi et al: "SEAL-lab Processing-in-Memory in ReRAM-based Main Memory", Nov. 30, 2015, XP055524308, 11 pages.

Leibin Ni et al: "An energy-efficient matrix multiplication accelerator by distributed in-memory computing on binary RRAM crossbar", 2016 21st Asia and South Pacific Design Automation Conference (ASP-DAC), IEEE, Jan. 25, 2016, pp. 280-285, XP032877600.

* cited by examiner

MEMORY DEVICE, AND DATA PROCESSING METHOD BASED ON MULTI-LAYER RRAM CROSSBAR ARRAY

CROSS-REFERENCE TO RELATED APPLICATIONS

This application is a continuation of International Application No. PCT/CN2016/071254, filed on Jan. 18, 2016, the disclosure of which is hereby incorporated by reference in its entirety.

TECHNICAL FIELD

Embodiments of the present disclosure relate to the storage field, and more specifically, to a memory device, and a data processing method based on a multilayer RRAM crossbar array.

BACKGROUND

Currently, many applications are related to complex big data computing such as fingerprint recognition and machine learning. For current big data computing, performance bottlenecks of a computing system mainly lie in the following two aspects:

Memory wall: With development of technologies, processor performance is continuously improving. However, memory performance improves quite slowly. Consequently, memory performance becomes a "short slab" for improving overall system performance, and this is referred to as a memory wall. Specifically, connection and communication between a processor and a memory are implemented by using an input/output (I/O) bus. Limited by hardware, the I/O bus has limited bandwidth. Consequently, in most time, the processor is in an idle state of waiting for memory.

Power wall: Currently, most memories are volatile memories. Therefore, to prevent a data loss, the volatile memories need to be energized all along. This leads to high dynamic power consumption and high static power consumption of the memories.

Generally, the following solutions are provided to the foregoing two problems.

A solution to the memory wall: A logic unit (or logic circuit) may be added to a memory, so that data is directly computed in the memory, that is, in-memory computing. Using summation of 10 numbers as an example, if the memory has only a data storage function, the processor needs to read the 10 numbers from the memory through an I/O bus, and sum the 10 numbers. If the memory has a logic operation function, the memory can directly compute the sum of the 10 numbers, and then send a computing result to the processor through the I/O bus. It may be found, from a comparison between the foregoing two implementations, that a memory with the logic operation function reduces transmission pressure of the I/O bus by 90%, so that memory wall restriction can be effectively mitigated.

A solution to the power wall: A non-volatile memory may be used to replace the volatile memory. Because the memory is non-volatile, a loss of data in the memory caused by power interruption does not occur. Therefore, in a data processing process, the entire memory does not need to be energized all along. In this way, power consumption is effectively reduced.

Development of a resistive random access memory (RRAM) technology makes it possible to resolve the foregoing two problems at the same time. First, a core device of an RRAM is a memristor (that is, a resistor in the RRAM is a memristor). The RRAM is non-volatile and can reduce power consumption. Further, as shown in FIG. 1, the RRAM has a crossbar array structure (therefore, the RRAM is generally referred to as an RRAM crossbar array, or an RRAM crossbar). The RRAM crossbar may be single-layer or multilayer. In a multilayer RRAM crossbar, an output of a layer may be used as an input of a next layer. A resistor array is disposed at each layer of the RRAM crossbar. If the resistor in the RRAM is considered as a neuron in a neural network, it may be found that the RRAM crossbar is structurally very similar to the neural network. Such a structure is very suitable for logic operation. Specifically, various logic operations may be implemented by configuring a quantity of layers of the RRAM crossbar, a size of a resistor array at each layer of RRAM crossbar, and a resistance value of each resistor.

In the prior art, a logic operation capability of the RRAM crossbar is already developed and used to some extent. FIG. 2 shows a conventional circuit structure of an RRAM crossbar that can perform a logic operation. First, a resistance value of a resistor in the RRAM crossbar needs to be configured according to a desired logic operation function (such as summation, exclusive OR, and matrix multiplication). Using matrix multiplication $Y=\Phi X$ as an example, first, each element in a matrix $\Phi$ may be stored in the RRAM crossbar. For example, a resistor $G_{ij}$ in FIG. 2 corresponds to an element in the $i^{th}$ row and the $j^{th}$ column of $\Phi$, and a resistance value of $G_{ij}$ represents a value of the corresponding element. Then, in actual matrix multiplication, elements of a matrix X are first converted from digital parameters $x_1 \ldots x_n$ into analog parameters (analog voltage signals), and are then input into rows of the RRAM. Then a point multiplication operation is performed on the elements in the matrix using voltage, current, and resistance relationships between rows and columns in the RRAM crossbar, so as to obtain computing results $V_1$ to $V_m$. Finally, the computing results (analog voltage parameters) are converted into digital parameters (such as y1 and y2) and are then output.

It may be learned, from the description above, that a conventional RRAM crossbar uses an analog parameter to perform a logic operation, and such an operation manner mainly has the following two disadvantages:

First, a large quantity of digital-to-analog converters (DAC) and analog-to-digital converters (ADC) are required for DA and AD conversion operations on signals. The converters and the conversion operations are time-consuming and power-consuming.

Second, to implement specific operation logic, the resistor in the RRAM needs to be configured or programmed in advance. In practice, the resistance value of the resistor in the RRAM is determined according to an integral of a current that flows through the resistor. However, characteristics of resistor elements in the RRAM are not constant and may fluctuate to some extent. Consequently, resistance values obtained by an integral operation on a same current may be different. Specifically, as shown in (a) in FIG. 3, affected by fluctuation of element characteristics, a resistor has different state conversion curves (from an $R_{on}$ state (also referred to as a low resistance state, or an on-state) to an intermediate state and then to an $R_{off}$ state (also referred to as a high resistance state, or an off-state), resulting in inaccuracy of resistance programming. In addition, it may be learned, from (b) in FIG. 3, that such inaccuracy is especially apparent in the intermediate state of the resistor.

SUMMARY

This application provides a memory device, to improve accuracy of a logic operation of a conventional RRAM crossbar.

According to a first aspect, a memory device is provided. The memory device includes a control bus and multiple memory units, the multiple memory units are connected to each other through the control bus, and each of the multiple memory units includes: a control module, where the control module is connected to a processor through the control bus, and receives and parses an instruction of the processor through the control bus, and the instruction of the processor includes a logic operation instruction; and a logic module, where the logic module is connected to the control module, the logic module includes at least one layer of RRAM crossbar array (that is, RRAM crossbar), a resistance value of a resistor in the at least one layer of RRAM crossbar array is $R_{on}$ or $R_{off}$, $R_{on}$ indicates a Boolean value 1, $R_{off}$ indicates a Boolean value 0, and the control module performs a Boolean operation using the at least one layer of RRAM crossbar array according to the logic operation instruction.

The resistor in the RRAM crossbar array is set to $R_{on}$ or $R_{off}$, and $R_{on}$ and $R_{off}$ are configured to respectively indicate Boolean values 1 and 0, such that a Boolean operation of the RRAM crossbar array is implemented, and accuracy of a logic operation of the RRAM crossbar array is improved.

With reference to the first aspect, in a first implementation of the first aspect, the logic operation instruction is configured to instruct the logic module to perform a point multiplication operation of a Boolean vector A and a Boolean vector B, A and B each indicate an N-dimensional Boolean vector, and N is a positive integer not less than 2; the logic module includes a multilayer RRAM crossbar array, the first layer of RRAM crossbar array in the multilayer RRAM crossbar array includes a resistor array having N rows×N columns, an input end of a resistor in each row at the first layer of RRAM crossbar array is connected to a word line, an output end of a resistor in each column at the first layer of RRAM crossbar array is connected to a bit line, N word lines of the first layer of RRAM crossbar array are connected to the control module, and N bit lines of the first layer of RRAM crossbar array are respectively connected to other layers of RRAM crossbar arrays in the multilayer RRAM crossbar array through N comparator circuits; the first layer of RRAM crossbar array generates N current signals on the N bit lines according to voltage signals input by the N word lines and a resistance value of a resistor at the first layer of RRAM crossbar array, a voltage value of a voltage signal input by the $j^{th}$ word line in the N word lines is a voltage value corresponding to $B_j$, a resistance value of a resistor in the $j^{th}$ row at the first layer of RRAM crossbar array is a resistance value corresponding to $A_j$, $B_j$ is the $j^{th}$ element of the Boolean vector B, is the $j^{th}$ element of the Boolean vector A, and a value of j ranges from 0 to N−1; the N comparator circuits respectively convert the N current signals into N voltage signals, and compare the N voltage signals with voltage thresholds respectively corresponding to the N comparator circuits, so that output ends of the N bit lines output a voltage signal corresponding to a first computing result, where the first computing result is an N-dimensional Boolean vector, first K elements of the first computing result are 1, remaining elements are 0, and K is an operation result of point multiplication of A and B; and the other layers of RRAM crossbar arrays receive the voltage signal corresponding to the first computing result from the output ends of the N bit lines, and obtain, according to the voltage signal corresponding to the first computing result and a resistance value of a resistor in the other layers of RRAM crossbar arrays, a voltage signal corresponding to a second computing result, where the second computing result is a binary representation of K.

A point multiplication operation of Boolean vectors is implemented using the multilayer RRAM crossbar array.

With reference to the first implementation of the first aspect, in a second implementation of the first aspect, the $j^{th}$ comparator circuit in the N comparator circuits includes a resistor $R_s$ of a constant resistance value and a comparator, one end of the resistor $R_s$ is connected to the $j^{th}$ bit line in the N bit lines and the comparator, the other end of the resistor $R_s$ is grounded, a voltage threshold of the $j^{th}$ comparator circuit is $V_r * g_{on} * R_s * (2j+1)/2$, $V_r$ indicates a voltage value corresponding to a Boolean value 1, and $g_{on}$ indicates a reciprocal of $R_{on}$.

With reference to the second implementation of the first aspect, in a third implementation of the first aspect, the logic module includes at least three layers of RRAM crossbar arrays, and the other layers of RRAM crossbar arrays include the second layer of RRAM crossbar array and the third layer of RRAM crossbar array; the second layer of RRAM crossbar array includes a (2N−1) rows×N columns resistor array, an input end of a resistor in each row at the second layer of RRAM crossbar array is connected to a word line, an output end of a resistor in each column at the second layer of RRAM crossbar array is connected to a bit line, and word lines of the second layer of RRAM crossbar array are connected to output ends of bit lines of the first layer of RRAM crossbar array; the second layer of RRAM crossbar array receives the voltage signal corresponding to the first computing result from the output ends of the bit lines of the first layer of RRAMs through the 2N−1 word lines, and performs a logic operation according to the voltage signal corresponding to the first computing result and a resistance value of a resistor at the second layer of RRAM crossbar array:

$$\overline{O}_{2,j} = \begin{cases} \overline{O}_{1,j} + O_{1,j+1}, & j < N-1 \\ \overline{O}_{1,j}, & j = N-1 \end{cases}$$

so as to obtain a voltage signal corresponding to an intermediate binary number, where $\overline{O}_{1,j}$ is a negation of a Boolean value corresponding to a voltage signal output by the $j^{th}$ bit line of the first layer of RRAM crossbar array, $O_{1,j-1}$ is a Boolean value corresponding to a voltage signal output by the $(j+1)^{th}$ bit line of the first layer of RRAM crossbar array, and $\overline{O}_{2,j}$ is a negation of a Boolean value corresponding to a voltage signal output by the $j^{th}$ bit line of the second layer of RRAM crossbar array; the third layer of RRAM crossbar array includes an N rows×n columns resistor array, an input end of a resistor in each row at the third layer of RRAM crossbar array is connected to a word line, an output end of a resistor in each column at the third layer of RRAM crossbar array is connected to a bit line, and n is greater than or equal to a minimum quantity of bits required for expressing the integer N in binary; and the third layer of RRAM crossbar array receives the voltage signal corresponding to the intermediate binary number from N bit lines of the second layer of RRAM crossbar array through N word lines of the third layer of RRAM crossbar array, and encodes the intermediate binary number according to the voltage signal corresponding to the intermediate binary number and a resistance value of a resistor at the third layer of RRAM crossbar array, so as to obtain the voltage signal corresponding to the second computing result.

That n is greater than or equal to a minimum quantity of bits required for expressing the integer N in binary may be understood as follows: Assuming that N=8, at least 4 bits are required for expressing N in binary, that is, 1000 represents N, and therefore, n≥4.

With reference to the third implementation of the first aspect, in a fourth implementation of the first aspect, the $j^{th}$ word line of the third layer of RRAM crossbar array is connected to the $j^{th}$ bit line of the second layer of RRAM crossbar array, and a resistance value of a resistor in the $j^{th}$ row of the third layer of RRAM crossbar array corresponds to a binary representation of the integer j+1.

With reference to any one of the first to the fourth implementations of the first aspect, in a fifth implementation of the first aspect, the Boolean vector A is any row vector of a Boolean matrix Φ, the Boolean vector B is any column vector of a Boolean matrix X, each of multiple logic modules in the memory device is responsible for point multiplication operations of some row vectors of the Boolean matrix Φ and some column vectors of the Boolean matrix X, and the multiple logic modules jointly implement a Boolean matrix multiplication operation of the Boolean matrix Φ and the Boolean matrix X.

With reference to any one of the first aspect or the foregoing implementations of the first aspect, in a sixth implementation of the first aspect, the instruction of the processor further includes a data read/write instruction, and each memory unit further includes: a storage module, where the storage module is connected to the control module, and the control module performs data reading/writing using the storage module according to the data read/write instruction.

According to a second aspect, a data processing method based on a multilayer RRAM crossbar array is provided. A resistance value of a resistor in the multilayer RRAM crossbar array is $R_{on}$ or $R_{off}$, $R_{on}$ indicates a Boolean value 1, $R_{off}$ indicates a Boolean value 0, the multilayer RRAM crossbar array is configured to perform a point multiplication operation of a Boolean vector A and a Boolean vector B, A and B each indicate an N-dimensional Boolean vector, N is a positive integer not less than 2, the first layer of RRAM crossbar array in the multilayer RRAM crossbar array includes a resistor array having N rows×N columns, an input end of a resistor in each row at the first layer of RRAM crossbar array is connected to a word line, an output end of a resistor in each column at the first layer of RRAM crossbar array is connected to a bit line, and N bit lines of the first layer of RRAM crossbar array are respectively connected to other layers of RRAM crossbar arrays in the multilayer RRAM crossbar arrays through N comparator circuits. The method includes: generating, by the first layer of RRAM crossbar array, N current signals on the N bit lines according to voltage signals input by N word lines of the first layer of RRAM crossbar array and a resistance value of a resistor at the first layer of RRAM crossbar array, where a voltage value of a voltage signal input by the $j^{th}$ word line in the N word lines is a voltage value corresponding to $B_j$, a resistance value of a resistor in the $j^{th}$ row at the first layer of RRAM crossbar array is a resistance value corresponding to $A_j$, $B_j$ is the $j^{th}$ element of the Boolean vector B, $A_j$ is the $j^{th}$ element of the Boolean vector A, and a value of j ranges from 0 to N−1; converting, by the N comparator circuits, the N current signals into N voltage signals, and comparing the N voltage signals with voltage thresholds respectively corresponding to the N comparator circuits, so that output ends of the N bit lines output a voltage signal corresponding to a first computing result, where the first computing result is an N-dimensional Boolean vector, first K elements of the first computing result are 1, remaining elements are 0, and K is an operation result of point multiplication of A and B; and receiving, by the other layers of RRAM crossbar arrays, the voltage signal corresponding to the first computing result from the output ends of the N bit lines, and obtaining, according to the voltage signal corresponding to the first computing result and a resistance value of a resistor in the other layers of RRAM crossbar arrays, a voltage signal corresponding to a second computing result, where the second computing result is a binary representation of K.

The resistor in the RRAM crossbar array is set to $R_{on}$ or $R_{off}$, and $R_{on}$ and $R_{off}$ are configured to respectively indicate Boolean values 1 and 0, so that a Boolean operation of the RRAM crossbar array is implemented, and accuracy of a logic operation of the RRAM crossbar array is improved.

With reference to the second aspect, in a first implementation of the second aspect, the logic module includes at least three layers of RRAM crossbar arrays, and the other layers of RRAM crossbar arrays include the second layer of RRAM crossbar array and the third layer of RRAM crossbar array; the second layer of RRAM crossbar array includes a (2N−1) rows×N columns resistor array, an input end of a resistor in each row at the second layer of RRAM crossbar array is connected to a word line, an output end of a resistor in each column at the second layer of RRAM crossbar array is connected to a bit line, and word lines of the second layer of RRAM crossbar array are connected to output ends of bit lines of the first layer of RRAM crossbar array; the third layer of RRAM crossbar array includes an N rows×n columns resistor array, an input end of a resistor in each row at the third layer of RRAM crossbar array is connected to a word line, an output end of a resistor in each column at the third layer of RRAM crossbar array is connected to a bit line, and n is greater than or equal to a minimum quantity of bits required for expressing the integer N in binary; and the receiving, by the other layers of RRAM crossbar arrays, the voltage signal corresponding to the first computing result from the output ends of the N bit lines, and obtaining, according to the voltage signal corresponding to the first computing result and a resistance value of a resistor in the other layers of RRAM crossbar arrays, a voltage signal corresponding to a second computing result includes: receiving, by the second layer of RRAM crossbar array, the voltage signal corresponding to the first computing result from the output ends of the bit lines of the first layer of RRAMs through the 2N−1 word lines, and performing a logic operation according to the voltage signal corresponding to the first computing result and a resistance value of a resistor at the second layer of RRAM crossbar array:

$$\overline{O}_{2,j} = \begin{cases} \overline{O}_{1,j} + O_{1,j+1}, & j < N-1 \\ \overline{O}_{1,j}, & j = N-1 \end{cases}$$

so as to obtain a voltage signal corresponding to an intermediate binary number, where $\overline{O}_{1,j}$ a negation of a Boolean value corresponding to a voltage signal output by the $j^{th}$ bit line of the first layer of RRAM crossbar array, $O_{1,j+1}$ is a Boolean value corresponding to a voltage signal output by the $(j+1)^{th}$ bit line of the first layer of RRAM crossbar array, and $\overline{O}_{2,j}$ is a negation of a Boolean value corresponding to a voltage signal output by the $j^{th}$ bit line of the second layer of RRAM crossbar array; and receiving, by the third layer of RRAM crossbar array, the voltage signal corresponding to the intermediate binary number from N bit lines of the second layer of RRAM crossbar array through N word lines of the third layer of RRAM crossbar array, and encoding the intermediate binary number according to the voltage signal corresponding to the intermediate binary number and a resistance value of a resistor at the third layer of RRAM crossbar array, so as to obtain the voltage signal corresponding to the second computing result.

With reference to the second aspect or the first implementation of the second aspect, in a second implementation of the second aspect, the $j^{th}$ comparator circuit in the N comparator circuits includes a resistor $R_s$ of a constant resistance value and a comparator, one end of the resistor $R_s$ is connected to the $j^{th}$ bit line in the N bit lines and the comparator, the other end of the resistor $R_s$ is grounded, a voltage threshold of the $j^{th}$ comparator circuit is $V_r * g_{on} * R_s * (2j+1)/2$, $V_r$ indicates a voltage value corresponding to a Boolean value 1, and $g_{on}$ indicates a reciprocal of $R_{on}$.

In some of the foregoing implementations, the storage module is a storage module based on the RRAM crossbar array. The storage module based on the RRAM crossbar array can reduce memory power consumption.

In some of the foregoing implementations, the control module includes: an instruction queue, configured to buffer an instruction of the processor; and an instruction decoder, configured to parse the instruction of the processor, and perform a corresponding operation according to a parsed instruction. The buffer queue is set in the control module, so that a wait time of the processor can be reduced.

In some of the foregoing implementations, the control module includes a static random access memory (Static Random Access Memory, SRAM), configured to store result data obtained from the logic module and/or the storage module, and the control module is further configured to send the result data to the processor.

In some of the foregoing implementations, the control module is a control module based on a complementary metal oxide semiconductor (CMOS).

This application improves accuracy of the logic operation of the RRAM crossbar.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure.

DESCRIPTION OF EMBODIMENTS

Figure 4:
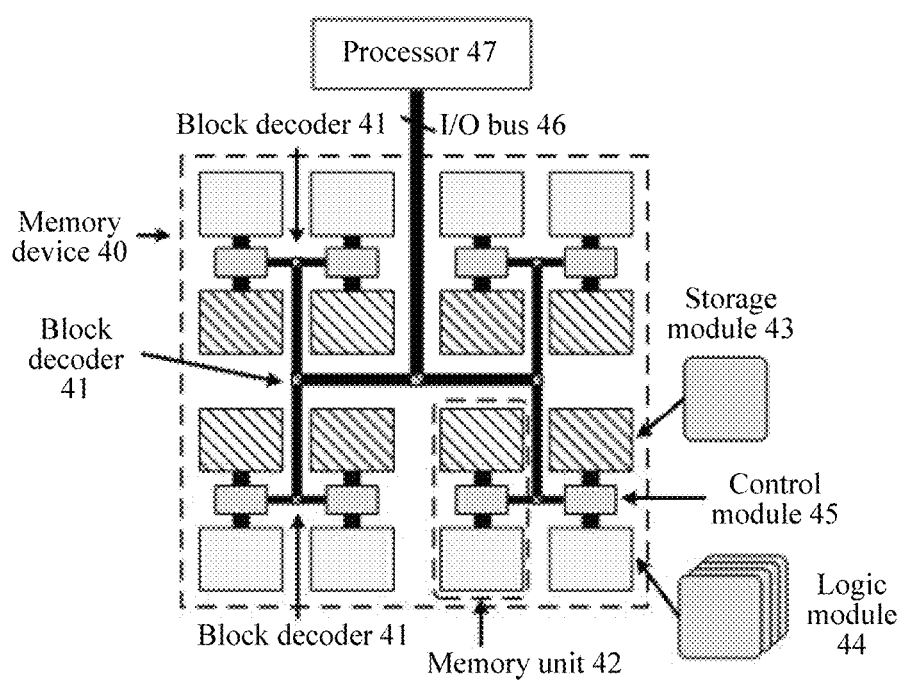
FIG. 4 is a schematic structural diagram of a memory device according to an embodiment of the present disclosure.

FIG. 4 is a schematic structural diagram of a memory device according to an embodiment of the present disclosure. From FIG. 4, that the memory device 40 is in an H-tree structure on the whole. In this structure, a storage module 43 (or referred to as a data module, a data array, or the like) is paired with a logic module 44 (or referred to as a logic circuit, a logic operation circuit, an in-memory logic, or the like).

In an embodiment, both the storage module 43 and the logic module 44 may be RRAM crossbars. Further, the storage module 43 may be a single-layer RRAM crossbar, and the logic module 44 may be a multilayer RRAM crossbar. In this disclosure, a type of the storage module 43 is not specifically limited in this embodiment of the present disclosure, and another type of storage medium may be used. In addition, even if both the storage module 43 and the logic module 44 are RRAM crossbars, a quantity of layers of the RRAM crossbar is not specifically limited in this embodiment of the present disclosure. For example, the storage module 43 may be designed as a multilayer RRAM crossbar, and the logic module 44 may be designed as a single-layer logic module 44 (a single-layer RRAM crossbar can also implement a simple logic operation).

Still referring to FIG. 4, the memory device 40 mainly includes four parts: a block decoder 41, a storage module 43, a logic module 44, and a control module 45. The control module 45 may be a CMOS-based control module. The storage module 43, the logic module 44, and the control module 45 may be included in a memory unit 42 (or referred to as a data/logic pair).

In FIG. 4, the control module 45 is separately connected to the storage module 43, the logic module 44, and the block decoder 41, and is connected to the processor 47 (such as a CPU) through the block decoder 41. The control module 45 receives and parses an instruction of the processor 47, and may further be responsible for data exchange or transmission between the storage module 43 and the logic module 44. The block decoder 41 may transfer the instruction delivered by the processor 47 to a control module 45 of a memory unit 42 corresponding to the instruction. In addition, in an embodiment, an address search function of the memory unit 42 may be integrated in the block decoder 41, and remaining control functions are all integrated in the control module 45.

From the foregoing description, that the control module 45 may be connected to the block decoder 41, but the block decoder 41 may be responsible only for transferring the instruction delivered by the processor 47 to the control module 45 of the corresponding memory unit 42. Therefore, from another perspective, the control module 45 may be considered as a main body for receiving and parsing the instruction of the processor. Using FIG. 5 as an example, the following describes, in detail, an internal structure of the control module and how the control module processes an instruction.

Figure 5:
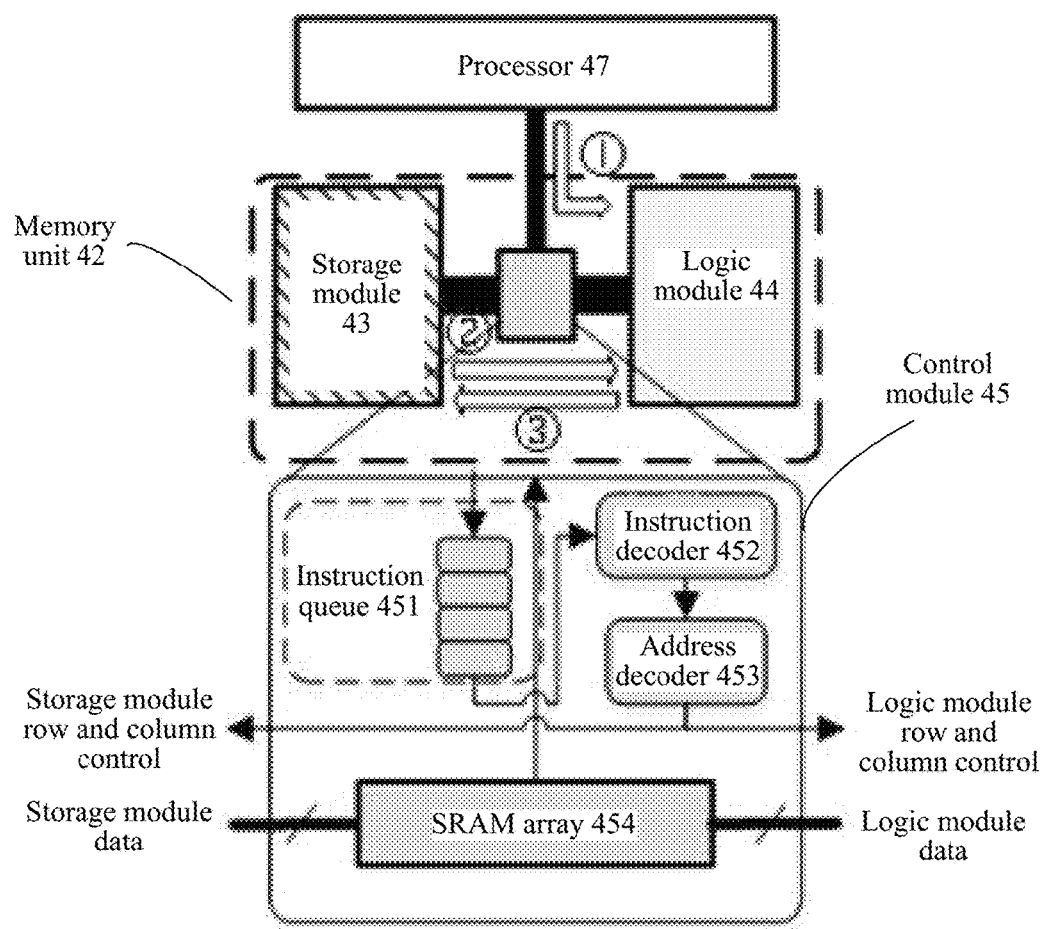
FIG. 5 shows an example of a bus design manner of a control module 45.

FIG. 5 shows an example of a bus design manner of a control module. The control module 45 may include an instruction queue 451, an instruction decoder 452, an address decoder 453, and an SRAM array 454, and a connection manner therebetween may be shown in FIG. 5. Considering that an operating frequency of the memory device may be lower than an operating frequency of the processor, the instruction queue 451 may be disposed in the control module 45 to buffer the instruction delivered by the processor 47, so as to reduce a wait time of the processor 47. The instruction decoder 452 parses a to-be-executed instruction (which may be, for example, an instruction of data reading, data storage, or memory computing, and is described in detail in the following), and then performs a corresponding operation. The address decoder 453 may decompose address information in the instruction into row/column information of the storage module 43 or row/column information of the logic module 44. The SRAM array 454 may be configured to temporarily store data that is read from the storage module 43 or the logic module 44, and according to the instruction, write the data into the storage module 43 or the logic module 44, or transfer the data back to the external processor 47.

A format and a type of the instruction delivered by the processor 47 to the memory device 40 are not specifically limited in this embodiment of the present disclosure. For example, the type of the instruction delivered by the processor 47 to the memory device 40 or a type of an instruction that needs to be parsed by the control module 45 may include 4 types of instructions listed in Table 1.

RRAM in the logic module 44, so that the logic module can implement particular logic such as summation, exclusive OR, and multiplication.

Figure 6:
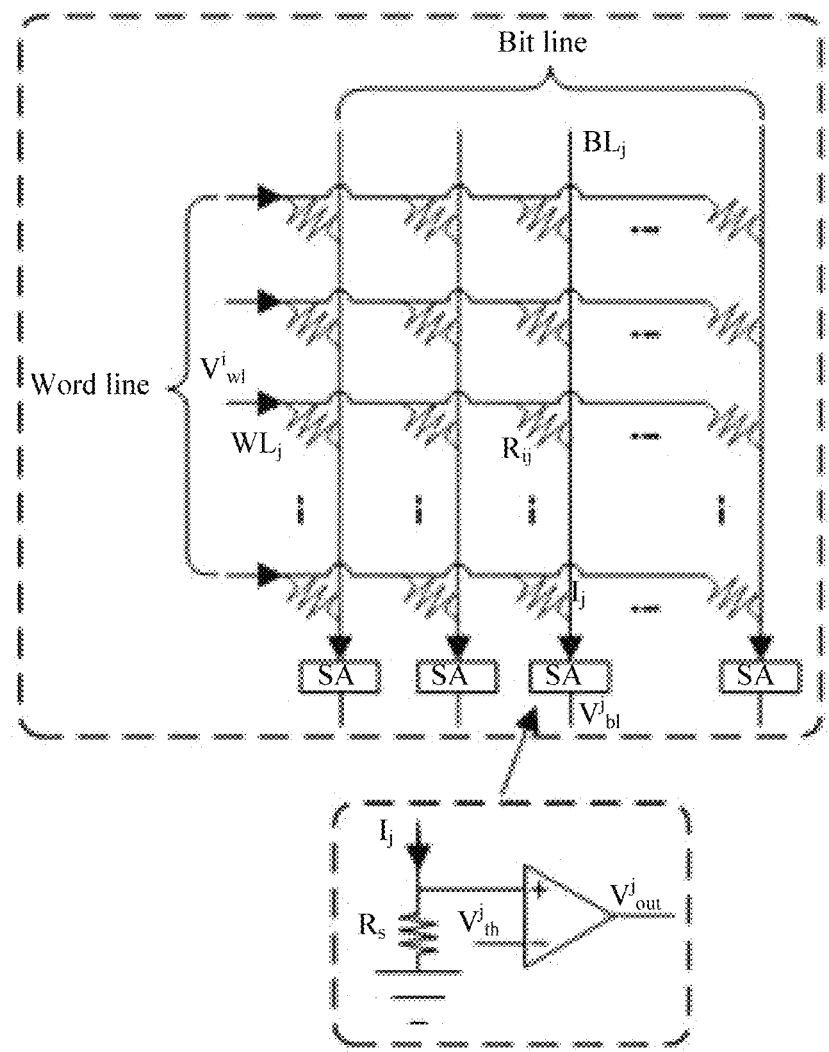
FIG. 6 is a schematic structural diagram of a layer of an RRAM crossbar.

Instruction 2: an SW instruction, which is used to write data in the processor 47 or the storage module 43 into an input column (a voltage $V_{w1}{}^i$ input by a word line (word line) in FIG. 6) of the logic module 44. A particular logic operation on input data can be implemented in the logic module based on previously configured operation logic. For example, the logic module 44 implements a+b summation logic. b may be stored into the logic module using the instruction 1, then a is input using the instruction 2, and then a and b are summed.

Instruction 3: an ST instruction, which is used to turn on all row/column switches of the logic module 44, so that a current flows through all rows/columns of the logic module 44.

Instruction 4: a WT instruction. When a complex logic operation is implemented using an RRAM crossbar, multiple layers of RRAM crossbars are needed in the logic module 44. In this case, it takes a time to complete computing of the RRAM crossbars. Therefore, the ST instruction may be used to instruct the control module 45 to wait for completion of memory computing of the logic module 44, and then execute a subsequent instruction.

TABLE 1

Types and parameters of instructions needing to be parsed by a control module 45

| Instruction | Operand 1 | Operand 2 | Operation | Application requiring this operation |
|---|---|---|---|---|
| SW (Store Word) | Data Address 1 | Address Address 2 | Store data in an address Read data from the address 1 and store the data into the address 2 | Write (ordinary write) in a storage module, write (logic configuration) in a logic module, data input configuration in a logic module, write-back after memory computing |
| LW (Load Word) | Address | — | Read data from an address to a processor | Ordinary read |
| ST (Start) | Memory unit serial number | — | Turn on all row/column switches of a logic module in a memory unit corresponding to this serial number | Performing memory computing |
| WT (Wait) | — | — | Wait for a completion signal of memory computing of a logic module | Preventing an instruction in an instruction queue from being operated during memory computing |

Using a memory computing process as an example, first, logic configuration is performed on the logic module 44, that is, a resistance value of a resistor in the logic module 44 is configured so that the logic module 44 can implement particular operation logic. Then an input signal is provided to the logic module 44. That is, data requiring a logic operation is input into the logic module 44. Then, memory computing may be performed in the logic module 44 according to the input signal and configured operation logic. The following describes in detail a memory computing process with reference to the instructions in Table 1.

When memory computing is needed, the processor 47 may deliver the following instructions to the memory device 40.

Instruction 1: an SW instruction, which is used to write data in the processor 47 or the storage module 43 into the logic module 44 to configure a resistance value of the Instruction 5: an SW instruction, which may be used to: after memory computing is completed, write data obtained by means of operation by the logic module 44 back into the storage module 43.

It should be noted that for particular logic, logic configuration needs to be performed on the logic module 44 only once, and the instruction 1 may not be necessarily executed each time before memory computing is performed. That is, a same logic operation can be implemented for different data by changing data in an input column of the logic module 44.

A process in which the control module 45 performs memory computing according to the instruction is described above in detail. It should be noted that the control module 45 may also perform ordinary data read/write according to an instruction. This process is similar to that in the prior art, and is not described herein in detail. Using FIG. 6 as an example, the following briefly describes a logic operation process of the logic module 44 based on an RRAM crossbar.

In FIG. 6, a comparator circuit is disposed at the bottom of each bit line (bit line). In practice, the comparator circuit may be a sense amplifier (SA). The SA includes a constant resistor $R_s$ (for example, $R_s < R_{on} < R_{off}$) with a relatively small resistance value, and an operational amplifier, so as to convert a current signal in a column (that is, a bit line) into a voltage, and compare the voltage with a voltage threshold at the first layer of RRAM crossbar to obtain a computing result of this column. Computing formulas for each column are as follows:

$$V_{bl}^j = R_s \sum_{i=1}^{m} g_{ij} V_{wl}^i \quad (1)$$

$$V_{out}^j = \begin{cases} 1, & V_{bl}^j > V_{th}^j \\ 0, & V_{bl}^j \le V_{th}^j \end{cases} \quad (2)$$

In a formula (1), $V_{wl}^r$ indicates a voltage of a word line of the $i^{th}$ row, $V_{bl}^j$ indicates a voltage of a bit line (bit line) of the $j^{th}$ column, $g_{ij}$ indicates an admittance (a reciprocal of $R_{ij}$) corresponding to a resistor $R_{ij}$, $V_{bl}^j$ indicates a voltage threshold corresponding to the $j^{th}$ column, and $V_{out}^j$ indicates an output voltage of the $j^{th}$ column. In addition, FIG. 6 merely shows a circuit structure of a single-layer RRAM crossbar. If the logic module 44 includes a multilayer RRAM crossbar, a column output $V_{out}^j$ of a layer may be used as a row input of a next layer. All layers may have a same structure or different structures. A column output $V_{out}^j$ of a last layer may be used as a final output of the logic module 44.

In order to use the RRAM crossbar to implement a particular logic operation (or function), the following steps may be performed to configure the resistance value of the resistor in the RRAM crossbar and a voltage threshold of each column (that is, the resistance value in the RRAM crossbar and the voltage threshold of each column determine logic actually implemented by the RRAM crossbar):

Step 1: In software (such as MatLab and Octave), determine a quantity of layers of the RRAM crossbar required for implementing the particular logic, and a size of rows and columns of each layer.

Step 2: Compute a resistance value of a resistor at each layer of RRAM crossbar, and a voltage threshold of the comparator circuit.

Step 3: Use an instruction to store the computed resistance value of the resistor in the RRAM crossbar into a corresponding resistor, and set the voltage threshold of the comparator circuit.

Step 4: Implement the particular logic computing using hardware (a circuit of the logic module 44).

Figure 1:
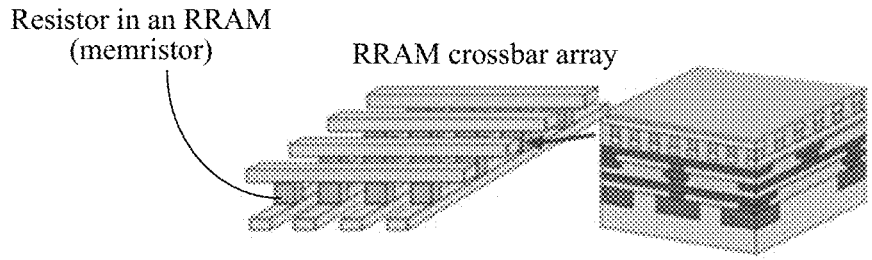
FIG. 1 is a schematic diagram of a physical structure of an RRAM crossbar.
Figure 2:
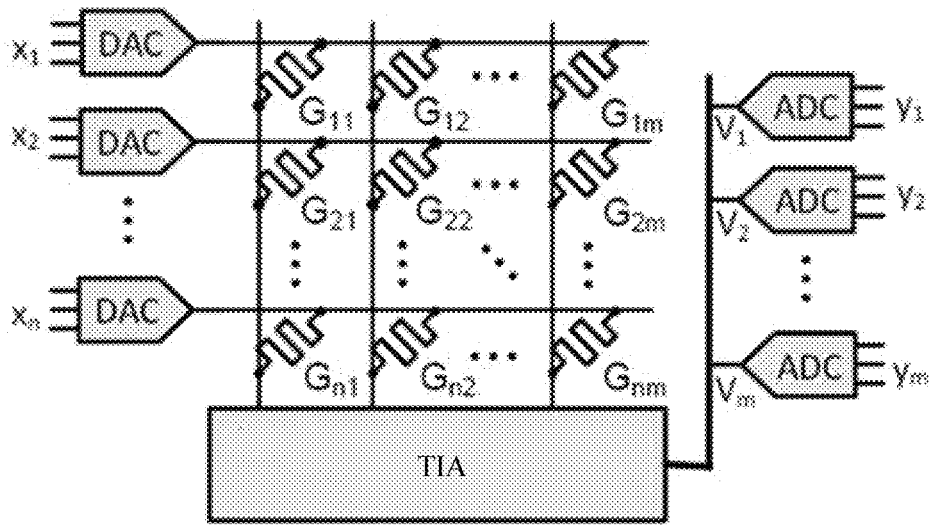
FIG. 2 is a structural diagram of a conventional logic circuit based on an RRAM crossbar.

Disadvantages of the RRAM crossbar based on an analog signal are described above in detail with reference to FIG. 2 and FIG. 3, for example, excessive AD and DA conversion operations, and errors existing in a resistance value configuration process. To overcome the disadvantages, the following describes, with reference to specific embodiments, specific implementations of an RRAM crossbar based on a digital signal.

Figure 3:
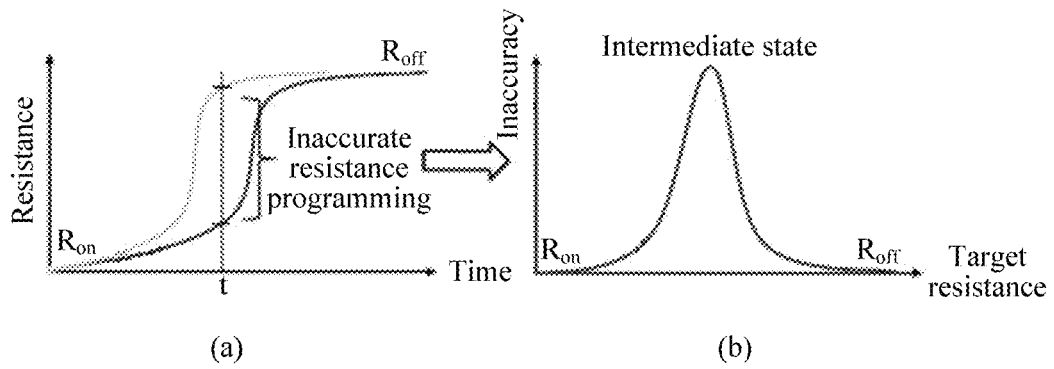
FIG. 3 is a curve of a resistance characteristic of a resistor in an RRAM crossbar.

First, it may be learned, from (b) in FIG. 3, that in comparison with an intermediate state, reliability is higher if the resistor in the RRAM crossbar is set to $R_{on}$ or $R_{off}$ (a process of configuring the resistor in the RRAM crossbar may be referred to as RRAM programming). That is, if only the resistor in the RRAM crossbar is set to $R_{on}$ or $R_{off}$, resistor configuration errors can be reduced, and logic operation reliability can be improved. Therefore, the resistor in the RRAM crossbar in this embodiment of the present disclosure is either set to an $R_{on}$ state or set to an $R_{off}$ state. $R_{off}$ may indicate a Boolean value "0" (or digit "0"), and $R_{on}$ may indicate a Boolean value "1" (or digit "1"). Then a row input interface of the RRAM crossbar may be designed as a pure digital interface, without a need for AD conversion (it may be learned, from FIG. 6, that a row input of the RRAM crossbar is a voltage signal, provided that the input voltage signal includes a high level and a low level, where the high level corresponds to the Boolean value 1, and the low level corresponds to the Boolean value 0; however, voltage values of the high level and the low level are not specifically limited in this embodiment of the present disclosure). By means of the foregoing settings, the logic module based on an analog signal shown in FIG. 2 may be converted into a logic module based on a digital signal.

Referring to FIG. 6, a resistor $R_s$ in an SA of each column may be a small resistor with a constant resistance value, and $R_{off} \gg R_{on} \gg R_s$ may be satisfied for $R_{off}$, $R_{on}$, and $R_s$. A comparator circuit (using an SA as an example in the figure) is connected to an end of each column. Referring to a formula (2), the SA compares a voltage of this column with a voltage threshold of the column to obtain an output voltage of this column. The output voltage is either a voltage (low level) corresponding to the Boolean value 0 or a voltage (high level) corresponding to the Boolean value 1.

It should be understood that particular logic can be implemented by configuring the resistor in the RRAM crossbar and the voltage threshold in each column of the word line. However, a type of the logic is not specifically limited in this embodiment of the present disclosure. Using Boolean matrix (elements in the matrix are all 0 and 1) multiplication as an example, the following describes in detail how to configure the resistance value of the resistor in the RRAM crossbar and configure the voltage threshold of the word line in the RRAM crossbar to implement the Boolean matrix multiplication.

For ease of understanding, a computing process of matrix multiplication $Y = \Phi X$ is described first.

General forms and vector forms of matrices X and (I) are as follows:

$$\Phi = \begin{bmatrix} \varphi_{11} & \varphi_{12} & \varphi_{13} & K \\ \varphi_{21} & \varphi_{22} & \varphi_{23} & K \\ \varphi_{31} & \varphi_{32} & \varphi_{33} & K \\ M & M & M & O \end{bmatrix} = \begin{bmatrix} \Phi_1 \\ \Phi_2 \\ \Phi_3 \\ M \end{bmatrix} \quad (3)$$

$$X = \begin{bmatrix} x_{11} & x_{12} & x_{13} & K \\ x_{21} & x_{22} & x_{23} & K \\ x_{31} & x_{32} & x_{33} & K \\ M & M & M & O \end{bmatrix} = \begin{bmatrix} X_1 & X_2 & X_3 & K \end{bmatrix}$$

A product of the matrix Φ and the matrix X may alternatively be considered as a product of a column vector $$\begin{bmatrix} \Phi_1 \\ \Phi_2 \\ \Phi_3 \\ M \end{bmatrix}$$

and a row vector $[X_1\ X_2\ X_3\ K]$. For details, refer to a formula (4):

$$Y = \Phi X = \begin{bmatrix} \Phi_1 \\ \Phi_2 \\ \Phi_3 \\ M \end{bmatrix} [X_1\ X_2\ X_3\ K] = \begin{bmatrix} (\Phi_1 \cdot X_1) & (\Phi_1 \cdot X_2) & (\Phi_1 \cdot X_3) & L \\ (\Phi_2 \cdot X_1) & (\Phi_2 \cdot X_2) & (\Phi_2 \cdot X_3) & K \\ (\Phi_3 \cdot X_1) & (\Phi_3 \cdot X_2) & (\Phi_3 \cdot X_3) & K \\ M & M & M & O \end{bmatrix} \quad (4)$$

It may be learned, from formulas (3) and (4), that each element of the matrix Y is a result of point multiplication of a row of the matrix Φ and a column of the matrix X (that is, computing an inner product).

In this embodiment of the present disclosure, first, a logic module is provided. The logic module may implement, based on a multilayer RRAM crossbar, point multiplication operation logic of a Boolean vector (the Boolean vector is a vector whose elements are 0 or 1). Based on this, a memory device that can implement a Boolean matrix (the Boolean matrix is a matrix whose elements are 0 or 1) multiplication operation is further provided in this embodiment of the present disclosure. The memory device may include one or more logic modules that can implement Boolean vector multiplication. Because a Boolean matrix multiplication operation may be decomposed into multiple point multiplication operations of Boolean vectors, the memory device may decompose the Boolean matrix multiplication operation into multiple point multiplication operations of Boolean vectors, and then distribute the multiple point multiplication operations of Boolean vectors to the one or more logic modules. The one or more logic modules jointly implement the Boolean matrix multiplication operation.

The following describes, in detail, a structure and functions of a multilayer RRAM crossbar for implementing a Boolean vector point multiplication operation using a Boolean vector $[\phi_{0,j},\phi_{1,j}\ \ldots\ \phi_{N-1,j}]$ (which may be considered as a vector formed by elements of any row in the Boolean matrix Φ, and corresponds to the Boolean vector A mentioned above) and a Boolean vector $[x_{i,0},x_{i,1}\ \ldots\ x_{i,N+1}]$ (which may be considered as a Boolean vector formed by elements of any column in the matrix X, and corresponds to the Boolean vector B mentioned above) as an example.

Figure 7:
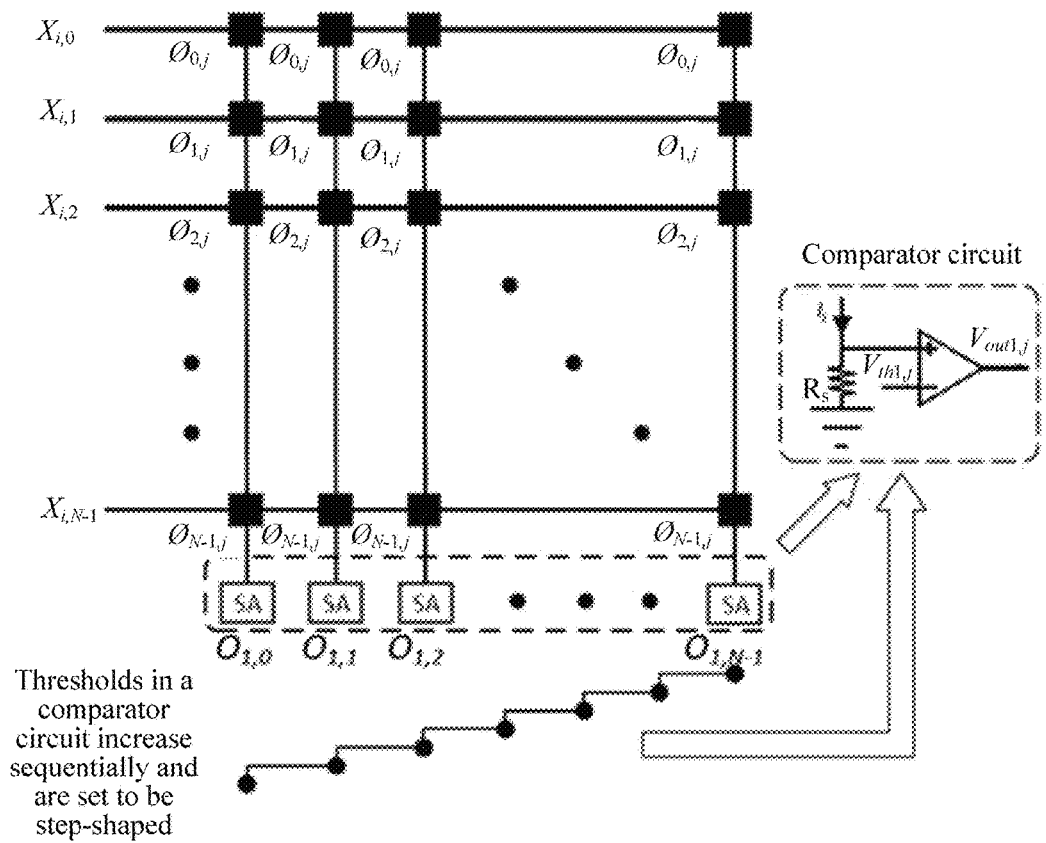
FIG. 7 is a circuit diagram of the first layer of RRAM crossbar in a three-layer RRAM crossbar used to implement Boolean matrix multiplication.

The multilayer RRAM crossbar may include three layers of RRAM crossbars. A circuit shown in FIG. 7 may be used at the first layer of RRAM crossbar in the three-layer RRAM crossbar. In FIG. 7, the first layer of RRAM crossbar includes an N×N resistor array. N resistors in each column of the N×N resistor array respectively indicate the Boolean vector $[\phi_{0,j},\phi_{1,j}\ \ldots\ \phi_{N-1,j}]$. For example, it is assumed that N is 8, and 8 elements of $[\phi_{0,j},\phi_{1,j}\ \ldots\ \phi_{N-1,j}]$ are 10101010 sequentially. Therefore, resistance values of the first column in the N×N resistor array of the first layer of RRAM crossbar are $R_{on}$ (corresponding to 1), $R_{off}$ (corresponding to 0), $R_{on}$, $R_{off}$, $R_{on}$, $R_{off}$, $R_{on}$, and $R_{off}$ sequentially, and a resistance configuration of each column in the N×N resistor array is the same as a resistance configuration of the first column.

A comparator circuit is disposed at the bottom of each column (bit line) of the N×N resistor array (an SA is used as an example of the comparator circuit in the following). The comparator circuit may include a constant resistor $R_s$ with a relatively small resistance value and a comparator. A function of the comparator circuit is converting a current signal in each column into a voltage signal, and comparing the voltage signal with a voltage threshold $V_{th1}$ of the column, so as to determine whether a computing result of this column is 0 or 1. The voltage threshold of each column in the N×N resistor array may be set to $V_r*g_{on}*R_s*(2j+1)/2$ sequentially, where j is a positive integer ranging from 0 to N−1. $V_r$ indicates an actual voltage (that is, a high level) when an input of X is 1, go, indicates an admittance corresponding to a resistor $R_{on}$, and $R_s$ indicates a resistance value of a sampling resistor. It may be learned, from this formula, that thresholds of columns in the N×N resistor array increase sequentially and are step-shaped on the whole (as shown in FIG. 7).

The following describes logic functions that can be implemented by the first layer of RRAM crossbar.

A voltage signal corresponding to the Boolean vector $[x_{i,0},x_{i,1}\ \ldots\ x_{i,N+1}]$ is input into the first layer of RRAM crossbar (that is, a high level is input into a word line corresponding to an element 1 in the Boolean vector $[x_{i,0}, x_{i,1}\ \ldots\ x_{i,N+1}]$, and a low level is input into a word line corresponding to an element 0 in the Boolean vector $[x_{i,0}, x_{i,1}\ \ldots\ x_{i,N+1}]$. As described above, a resistance value of a resistor in each column at the first layer of RRAM crossbar is a resistance value corresponding to the Boolean vector $[\phi_{0,j},\phi_{1,j}\ \ldots\ \phi_{N-1,j}]$. When all row/column switches of the first layer of RRAM crossbar are turned on, point multiplication logic of the Boolean vector $[\phi_{0,j},\phi_{1,j}\ \ldots\ \phi_{N-1,j}]$ and the Boolean vector $[x_{i,0},x_{i,1}\ \ldots\ x_{i,N+1}]$ is implemented on each bit line of the first layer of RRAM crossbar based on a relationship between a voltage and a current. A result of the point multiplication logic may be represented by a current on each word line. Then, at an output end of the bit line, an SA connected to the word line of the first layer of RRAM crossbar outputs a voltage signal corresponding to a first computing result by setting the step-shaped voltage thresholds described above. The first computing result is an N-dimensional Boolean vector, first K elements of the first computing result is 1, remaining elements are 0, and K is a result of a point multiplication operation on the Boolean vector $[\phi_{0,j},\phi_{1,j}\ \ldots\ \phi_{N-1,j}]$ and the Boolean vector $[x_{i,0}, x_{i,1}\ \ldots\ x_{i,N+1}]$. For example, it is assumed that N=8 and K=3. By means of a logic operation of the first layer of RRAM crossbar, an output $O_{1,j}$ ($0 \leq j \leq N-1$) result of the first layer of RRAM crossbar is 11100000. It may be understood as follows: all comparison results of SAs in columns 0 to 3 are that column voltages are greater than voltage thresholds, and all comparison results of SAs in columns 4 to 7 are that column voltages are less than voltage thresholds.

Next, a logic task of the second layer of RRAM crossbar and the third layer of RRAM crossbar in the three-layer RRAM crossbar is converting an output result of the first layer of RRAM crossbar into a binary representation of K. Still using K=3 as an example, the output result of the first layer of RRAM crossbar is 11100000, and the logic task of the second layer of RRAM crossbar and the third layer of RRAM crossbar is converting 11100000 into 11, that is, 3 in binary. The following further describes structures and logic functions of the second layer of RRAM crossbar and the third layer of RRAM crossbar (herein, the second layer of RRAM crossbar and the third layer of RRAM crossbar jointly complete the foregoing logic task, but this is not limited in this embodiment of the present disclosure; and the foregoing logic task may alternatively be implemented by one layer of RRAM crossbar or more than three layers of RRAM crossbars).

Figure 8:
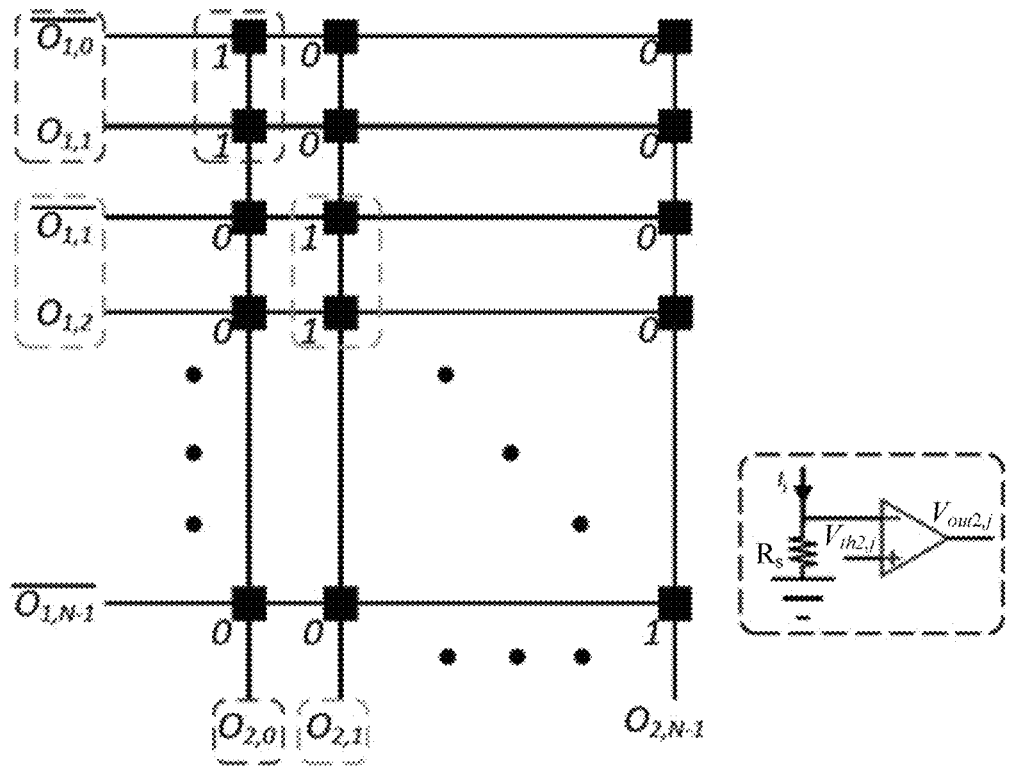
FIG. 8 is a circuit diagram of the second layer of RRAM crossbar in a three-layer RRAM crossbar used to implement Boolean matrix multiplication.

To implement the foregoing logic task, a structure shown in FIG. 8 may be used for the second layer of RRAM crossbar. In FIG. 8, the second layer of RRAM crossbar includes a (2N−1)×N resistor array. Resistance values of the $(2j)^{th}$ and $(2j+1)^{th}$ resistors in the $j^{th}$ column of resistors of the second layer of RRAM crossbar are $R_{on}$, and resistance values of remaining resistors are $R_{off}$, where 0≤j≤N−2. A resistance value of the $(2N−1)^{th}$ resistor in the $(N−1)^{th}$ column of resistors of the second layer of RRAM crossbar is $R_{on}$, and resistance values of remaining resistors are $R_{off}$. 2N−1 word lines of the second layer of RRAM crossbar may be connected to the bit line output end $O_{1,j}$ of the first layer of RRAM crossbar according to a connection relationship shown in FIG. 8. It should be noted that output ends of some bit lines of the first layer of RRAM crossbar require a negation operation before being connected to word lines of the second layer of RRAM crossbar. Referring to $\overline{O}_{1,j}$ shown in FIG. 7, such a negation operation may be implemented by connecting to a device such as a comparator or a phase inverter. This is not specifically limited in this embodiment of the present disclosure. An end of each bit line at the second layer of RRAM crossbar is connected to a comparator circuit. A voltage threshold $V_{th2}$ of the comparator circuit may be set to $V_r*g_{on}*R_s/2$. In addition, a positive pole and a negative pole of a comparator in an operation circuit need to be swapped (that is, the voltage threshold $V_{th2}$ is set at an in-phase input end of the comparator, and a reverse-phase input end is connected to the resistor $R_s$ and the bit line) to obtain an output $O_{2,j}$ of the second layer, where 0≤j≤N−1.

A relationship between the output $O_{2,j}$ of the second layer of RRAM crossbar and the output of the first layer of RRAM crossbar may be expressed by a formula (5). That is, the formula (5) is a logic function to be implemented by the second layer of the RRAM crossbar.

$$\overline{O}_{2,j} = \begin{cases} \overline{O}_{1,j} + O_{1,j+1}, & j < N-1 \\ \overline{O}_{1,j}, & j = N-1 \end{cases} \quad (5)$$

Logic expressed by the formula (5) is actually exclusive-OR logic. That is, an exclusive-OR operation is performed pairwise on the first computing result output by the first layer of RRAM crossbar to obtain an intermediate binary number. The intermediate binary number is an N-dimensional vector. The $(K−1)^{th}$ element of the N-dimensional vector is 1, and remaining elements are 0. K is a result of a point multiplication operation on the Boolean vector $[\phi_{0,j},\phi_{1,j} \ldots \phi_{N-1,j}]$ and the Boolean vector $[x_{i,0},x_{i,1} \ldots x_{i,N+1}]$. That an output result of the first layer of RRAM crossbar is 11100000 is used as an example. An obtained result is 00100000 after the logic operation of the second layer is performed. However, it should be noted that a structure of the RRAM crossbar for implementing the exclusive-OR logic is not specifically limited in this embodiment of the present disclosure, and FIG. 8 is merely an example. In practice, the exclusive-OR logic may alternatively be implemented by configuring resistance values of resistors and voltage thresholds in another manner.

Figure 9:
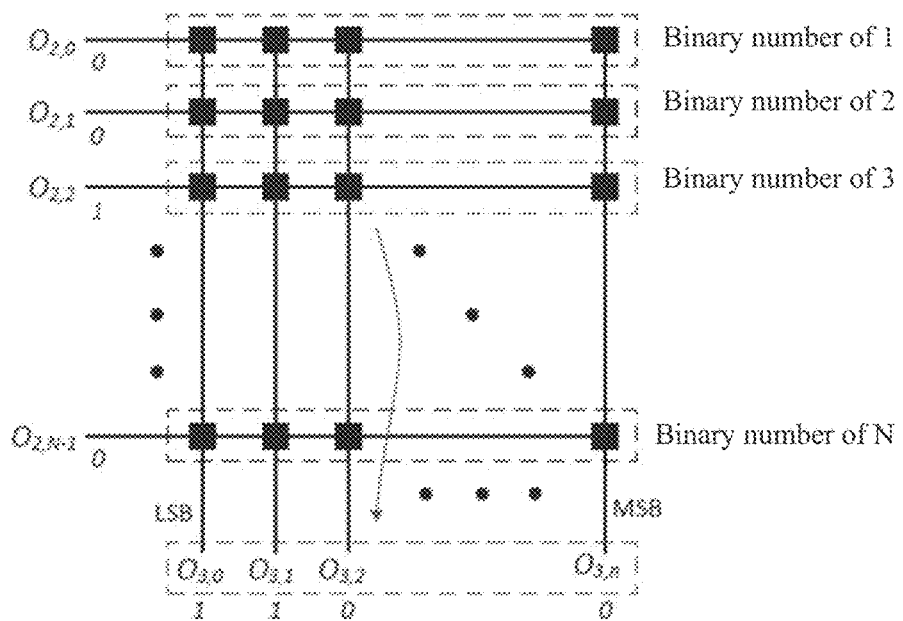
FIG. 9 is a circuit diagram of the third layer of RRAM crossbar in a three-layer RRAM crossbar used to implement Boolean matrix multiplication.

The second layer of RRAM crossbar transfers the voltage signal corresponding to the intermediate binary number to the word lines of the second layer of RRAM crossbar. The output end $O_{2,j}$ of the $j^{th}$ bit line of the second layer of RRAM crossbar is connected to the input end of the $j^{th}$ word line of the third layer of RRAM crossbar. A logic circuit of the third layer of RRAM crossbar is shown in FIG. 9. The third layer of RRAM crossbar includes an N×n resistor array, where n is greater than or equal to a minimum quantity of bits required for expressing the integer N in binary (for example, N=8, a binary representation of 8 is 1000, that is, the binary representation of 8 requires 4 bits, and therefore, n is greater than or equal to 4). Resistance values of N rows of resistors are set so that the resistors indicate binary 1 to N sequentially from top to bottom. In this way, when the voltage signal corresponding to the intermediate operation result output by the second layer of RRAM crossbar is used as an input voltage signal of the third layer of RRAM crossbar, because the $(K-1)^{th}$ element of the intermediate operation result is a Boolean value 1 and remaining elements are a Boolean value 0, the $(K-1)^{th}$ bit line of the third layer of RRAM crossbar inputs a voltage signal (high level) corresponding to the Boolean value 1, and remaining bit lines each input a voltage signal (low level) corresponding to the Boolean value 0. From a logic perspective, by means of such a configuration, an operation result (corresponding to the second operation result described above) finally output by the third layer of RRAM crossbar is a binary representation of K. That is, a binary representation of an integer corresponding to resistors in the $(K-1)^{th}$ row of the third layer of RRAM crossbar (it may be learned, as described above, that the resistors in the $(K-1)^{th}$ row correspond to the binary representation of the integer K) is selected as a final operation result. An output of the third layer of RRAM crossbar is a voltage signal corresponding to the final operation result.

Still using N=8 and K=3 as an example, a logic output of the second layer of RRAM crossbar is 00100000. A logic correspondence between an input and an output of the third layer of RRAM crossbar is shown in the following table.

TABLE 2

Input and output comparison table of a third layer of RRAM crossbar

| Logic input of a third layer of RRAM crossbar | Row serial number | Logic output of a third layer of RRAM crossbar |
| --- | --- | --- |
| 00000000 | None | |
| 10000000 | 0 | 0001 |
| 01000000 | 1 | 0010 |
| 00100000 | 2 | 0011 |
| 00010000 | 3 | 0100 |
| 00001000 | 4 | 0101 |
| 00000100 | 5 | 0110 |
| 00000010 | 6 | 0111 |
| 00000001 | 7 | 1000 |

It may be learned, from the foregoing table, that an output corresponding to 00100000 is 0011, that is, a binary representation of 3.

It should be noted that if an input matrix is a non-Boolean matrix (for example, the input matrix is a positive real matrix), the matrix may be decomposed into a linear combination of multiple Boolean matrices by means of linear algebra. Then, operations are performed on the multiple Boolean matrices in the foregoing manner, and then results of the operations on the multiple Boolean matrices are linearly combined to obtain a matrix multiplication result corresponding to the real matrix. Details are not described again in this embodiment of the present disclosure.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure. The foregoing descriptions are merely specific embodiments of the present disclosure, but are not intended to limit the protection scope of the present disclosure.

What is claimed is:

1. A data processing apparatus comprising:

a control bus; and multiple memory units connected by the control bus, each of the multiple memory units comprising a control circuit and a computation circuit, wherein the computation circuit comprises a first resistive random access memory (RRAM) crossbar array and a format conversion circuit, the first RRAM crossbar array having multiple rows and multiple columns of memory cells, multiple word lines connected to respective rows of memory cells, and a plurality of comparator circuits each connected to a corresponding column of the first RRAM crossbar array, wherein the comparator circuits are set to have incremental thresholds, and outputs of the comparator circuits are connected to the format conversion circuit;

wherein the control circuit is connected to the control bus and configured to:

receive a computation instruction for performing a vector multiplication of vector A and vector B;

setting the memory cells in the first RRAM crossbar array such that states of memory cells of each column of the first RRAM crossbar array correspond to elements of vector B;

setting the word lines of the first RRAM crossbar array according to elements of vector A;

wherein the outputs of the comparator circuits are voltage signals corresponding to a first binary number in which a number of bits with a value 1 indicates a numerical result of multiplication of vector A and vector B;

the format conversion circuit being set up to convert the outputs of the comparator circuits into an output corresponding to a second binary number having a numerical value equal to the numerical result of multiplication of vector A and vector B.

2. The data processing apparatus according to claim 1, wherein the format conversion circuit comprises:

a second RRAM crossbar array connected to receive the outputs of the comparator circuits and configured to generate an output that corresponds to an intermediate binary number in which a location of a bit with a value 1 indicates the numerical result of multiplication of vector A and vector B; and a third RRAM crossbar array connected to receive the output of the second RRAM crossbar array and configured to generate the output corresponding to the second binary number.

3. The data processing apparatus according to claim 2, wherein the multiple rows and multiple columns of memory cells in the first RRAM crossbar array comprise N rows×N columns resistors, an input end of a resistor in each row at the first RRAM crossbar array is connected to a word line, an output end of a resistor in each column at the first RRAM crossbar array is connected to a bit line, N word lines of the first RRAM crossbar array are connected to the control circuit, and each of N bit lines of the first RRAM crossbar array are respectively connected to a comparator circuit of the plurality of comparator circuits;

the first RRAM crossbar array generates N current signals on the N bit lines according to voltage signals input by the N word lines and a resistance value of a resistor at the first RRAM crossbar array, a voltage value of a voltage signal input by the $j^{th}$ word line in the N word lines is a voltage value corresponding to $B_j$, a resistance value of a resistor in the $j^{th}$ row at the first RRAM crossbar array is a resistance value corresponding to $A_A$, $B_j$ is the $j^{th}$ element of vector B, $A_j$ is the $j^{th}$ element of vector A, and a value of j ranges from 0 to N−1, wherein each of vector A and vector B indicates an N-dimensional vector, each elements of vector A and vector B indicates a value 1 or 0, and N is a positive integer not less than 2;

the N comparator circuits respectively convert the N current signals into N voltage signals, and compare the N voltage signals with voltage thresholds respectively corresponding to the N comparator circuits, to output, from output ends of the comparator circuits, the voltage signals corresponding to the first binary number, wherein the first binary number is an N-dimensional vector, first K elements of the first binary number are 1, remaining elements are 0, and K is the result of multiplication of vector A and vector B; and the format conversion circuit receives the voltage signals corresponding to the first binary number from the output ends of the comparator circuits, and generates, according to the voltage signals corresponding to the first binary number and resistance values of resistors in the format conversion circuit, voltage signals corresponding to the second binary number, wherein the second binary number is a binary representation of K.

4. The data processing apparatus according to claim 3, wherein the $j^{th}$ comparator circuit in the N comparator circuits comprises a resistor $R_s$ of a constant resistance value and a comparator, one end of the resistor $R_s$ is connected to the $j^{th}$ bit line in the N bit lines and the comparator, the other end of the resistor $R_s$ is grounded, a voltage threshold of the $j^{th}$ comparator circuit is $V_r * g_{on} * R_s * (2j+1)/2$, $V_r$ indicates a voltage value corresponding to a value 1, and $g_{on}$ indicates a reciprocal of $R_{on}$.

5. The data processing apparatus according to claim 4, wherein the second RRAM crossbar array comprises a (2N−1) rows×N columns resistor array, an input end of a resistor in each row at the second RRAM crossbar array is connected to a word line, an output end of a resistor in each column at the second RRAM crossbar array is connected to a bit line, and each of word lines of the second RRAM crossbar array is connected to a output end of a comparator circuit in the first RRAM crossbar array;

the second RRAM crossbar array receives the voltage signals corresponding to the first binary number from the output ends of the comparator circuits of the first RRAM crossbar array through the 2N−1 word lines, and performs a logic operation according to the voltage signal corresponding to the first computing result and a resistance value of a resistor at the second layer of RRAM crossbar array:

$$\overline{O}_{2,j} = \begin{cases} \overline{O}_{1,j} + O_{1,j+1}, & j < N-1 \\ \overline{O}_{1,j}, & j = N-1 \end{cases}$$

to obtain voltage signals corresponding to the intermediate binary number, wherein $\overline{O}_{1,j}$ is a negation of a value corresponding to a voltage signal output by a comparator circuit connected to the $j^{th}$ bit line of the first RRAM crossbar array, $O_{1,j+1}$ is a value corresponding to a voltage signal output by a comparator circuit connected to the $(j+1)^{th}$ bit line of the first RRAM crossbar array, and $\overline{O}_{2,j}$ is a negation of a value corresponding to a voltage signal output by the $j^{th}$ bit line of the second RRAM crossbar array;

the third RRAM crossbar array comprises an N rows×n columns resistor array, an input end of a resistor in each row at the third RRAM crossbar array is connected to a word line, an output end of a resistor in each column at the third RRAM crossbar array is connected to a bit line, and n is greater than or equal to a minimum quantity of bits required for expressing the integer N in binary; and the third RRAM crossbar array receives voltage signals corresponding to the intermediate binary number from N bit lines of the second RRAM crossbar array through N word lines of the third RRAM crossbar array, and encodes the intermediate binary number according to the voltage signals corresponding to the intermediate binary number and resistance values of resistors at the third RRAM crossbar array to obtain voltage signals corresponding to the second binary number.

6. The data processing apparatus according to claim 5, wherein the $j^{th}$ word line of the third RRAM crossbar array is connected to the $j^{th}$ bit line of the second RRAM crossbar array, and a resistance value of a resistor in the $j^{th}$ row of the third RRAM crossbar array corresponds to a binary representation of the integer j+1.

7. The data processing apparatus according to claim 1, wherein vector A is a row vector of a matrix Φ, vector B is a column vector of a matrix X, each of the multiple computation circuits in the memory device is set for performing point multiplication operations of a plurality of row vectors of the matrix Φ and a plurality of column vectors of the matrix X, and the multiple computation circuits jointly implement a matrix multiplication operation of the matrix Φ and the matrix X.

8. The data processing apparatus according to claim 1, wherein the instruction of the processor further comprises a data access instruction, and each memory unit further comprises:

a storage circuit, wherein the storage circuit is connected to the control circuit, and the control circuit read data from the computation circuit or write data into the computation circuit according to the data access instruction.

9. A data processing apparatus comprising:
a control bus; and
a memory unit connected to the control bus, the memory unit comprising a control circuit and a computation circuit, wherein the computation circuit comprises a first resistive random access memory (RRAM) crossbar having multiple rows and multiple columns of memory cells, multiple word lines connected to respective rows of memory cells, and a plurality of comparator circuits each connected to a corresponding column of the first RRAM crossbar array, wherein the comparator circuits are set to have incremental thresholds;

wherein the control circuit is connected to the control bus and configured to:

receive a computation instruction for performing a vector multiplication of vector A and vector B;

setting the memory cells in the first RRAM crossbar array such that states of memory cells of each column of the first RRAM crossbar array correspond to elements of vector B; and setting the word lines of the first RRAM crossbar array according to elements of vector A;

wherein the outputs of the comparator circuits are voltage signals corresponding to a first binary number in which a number of bits with a value 1 indicates a numerical result of multiplication of vector A and vector B.

10. The data processing apparatus according to claim 9, wherein the computation circuit further comprises a second RRAM crossbar array and a third RRAM crossbar array each having multiple rows and multiple columns of memory cells and multiple word lines connected to respective rows of memory cells, wherein outputs of the comparator circuits are connected to corresponding word lines of the second RRAM crossbar array, outputs of the second RRAM crossbar array are connected to corresponding words lines of the third RRAM crossbar array, wherein the second RRAM crossbar array being set up to convert the outputs of the comparator circuits into an output representing an intermediate binary number in which a location of a bit with a value 1 indicates the numerical result of multiplication of vector A and vector B; and the third RRAM crossbar array being set up to convert the output of the second RRAM crossbar into an output representing a second binary number having a numerical value equal to the numerical result of multiplication of vector A and vector B.

11. The data processing apparatus according to claim 10, wherein the multiple rows and multiple columns of memory cells in the first RRAM crossbar array comprise N rows×N columns resistors, an input end of a resistor in each row at the first RRAM crossbar array is connected to a word line, an output end of a resistor in each column at the first RRAM crossbar array is connected to a bit line, N word lines of the first RRAM crossbar array are connected to the control circuit, and each of N bit lines of the first RRAM crossbar array are respectively connected to a comparator circuit of the plurality of comparator circuits;

the first RRAM crossbar array generates N current signals on the N bit lines according to voltage signals input by the N word lines and a resistance value of a resistor at the first RRAM crossbar array, a voltage value of a voltage signal input by the $j^{th}$ word line in the N word lines is a voltage value corresponding to 4, a resistance value of a resistor in the $j^{th}$ row at the first RRAM crossbar array is a resistance value corresponding to A, 4 is the $j^{th}$ element of vector B, $A_j$ is the $j^{th}$ element of vector A, and a value of j ranges from 0 to N−1, wherein each of vector A and vector B indicates an N-dimensional vector, each elements of vector A and vector B indicates a value 1 or 0, and N is a positive integer not less than 2;

the N comparator circuits respectively convert the N current signals into N voltage signals, and compare the N voltage signals with voltage thresholds respectively corresponding to the N comparator circuits, to output, from output ends of the N comparator circuits, the voltage signals corresponding to the first binary number, wherein the first binary number is an N-dimensional vector, first K elements of the first binary number are 1, remaining elements are 0, and K is the result of multiplication of vector A and vector B;

the second RRAM crossbar array receives the voltage signals corresponding to the first binary number from the output ends of the comparator circuits, and obtain, according to the voltage signals corresponding to the first binary number and resistance values of resistors in the second RRAM crossbar array, voltage signals corresponding to the intermediate binary number in which a location of a bit with a value 1 indicates the numerical result of multiplication of vector A and vector B; and the third RRAM crossbar array receives the voltage signals corresponding to the intermediate binary number from the bit lines of second RRAM crossbar array, and convert the intermediate binary number into the second binary number, wherein the second binary number is a binary representation of K.

12. The data processing apparatus according to claim 11, wherein the $j^{th}$ comparator circuit in the N comparator circuits comprises a resistor R of a constant resistance value and a comparator, one end of the resistor $R_s$ is connected to the $j^{th}$ bit line in the N bit lines and the comparator, the other end of the resistor $R_s$ is grounded, a voltage threshold of the $j^{th}$ comparator circuit is $V_r*g_{on}*R_s*(2j+1)/2$, $V_r$ indicates a voltage value corresponding to a value 1, and $g_{on}$ indicates a reciprocal of $R_{on}$.

13. The data processing apparatus according to claim 11, wherein the second RRAM crossbar array comprises a (2N−1) rows×N columns resistor array, an input end of a resistor in each row at the second RRAM crossbar array is connected to a word line, an output end of a resistor in each column at the second RRAM crossbar array is connected to a bit line, and each of word lines of the second RRAM crossbar array is connected to a output end of a comparator circuit in the first RRAM crossbar array;

the second RRAM crossbar array receives the voltage signals corresponding to the first binary number from the output ends of the comparator circuits of the first RRAM crossbar array through the 2N−1 word lines, and performs a logic operation according to the voltage signals corresponding to the first binary number and a resistance value of a resistor at the second RRAM crossbar array:

$$\overline{O}_{2,j} = \begin{cases} \overline{O}_{1,j} + O_{1,j+1}, & j < N-1 \\ \overline{O}_{1,j}, & j = N-1 \end{cases}$$

to obtain voltage signals corresponding to an intermediate binary number, wherein $\overline{O}_{1,j}$ is a negation of a value corresponding to a voltage signal output by a comparator circuit connected to the $j^{th}$ bit line of the first RRAM crossbar array, $O_{1,j+1}$ a value corresponding to a voltage signal output by a comparator circuit connected to the $(j+1)^{th}$ bit line of the first RRAM crossbar array, and $\overline{O}_{2,j}$ is a negation of a value corresponding to a voltage signal output by the $j^{th}$ bit line of the second RRAM crossbar array;

the third RRAM crossbar array comprises an N rows×n columns resistor array, an input end of a resistor in each row at the third RRAM crossbar array is connected to a word line, an output end of a resistor in each column at the third RRAM crossbar array is connected to a bit line, and n is greater than or equal to a minimum quantity of bits required for expressing the integer N in binary; and the third RRAM crossbar array receives voltage signals corresponding to the intermediate binary number from N bit lines of the second RRAM crossbar array through N word lines of the third RRAM crossbar array, and encodes the intermediate binary number according to the voltage signals corresponding to the intermediate binary number and resistance values of resistors at the third RRAM crossbar array to obtain voltage signals corresponding to the second binary number.

14. The data processing apparatus according to claim 13, wherein the $j^{th}$ word line of the third RRAM crossbar array is connected to the $j^{th}$ bit line of the second RRAM crossbar array, and a resistance value of a resistor in the $j^{th}$ row of the third RRAM crossbar array corresponds to a binary representation of the integer j+1.

15. The data processing apparatus according to claim 9, wherein the memory device comprises multiple memory units, each of the multiple memory units comprises a control circuit and a computation circuit, vector A is a row vector of a matrix Φ and vector B is a column vector of a matrix X, each of the multiple computation circuits in the memory device is set for performing point multiplication operations of a plurality of row vectors of the matrix Φ and a plurality of column vectors of the matrix X, and the multiple computation circuits jointly implement a matrix multiplication operation of the matrix Φ and the matrix X.

16. The data processing apparatus according to claim 9, wherein the instruction of the processor further comprises a data access instruction, and the memory unit further comprises:

a storage circuit, wherein the storage circuit is connected to the control circuit, and the control circuit read data from the computation circuit or write data into the computation circuit according to the data access instruction.

17. A computing device, comprising:
a processor configured to send a computation instruction;
a memory device connected to the processor, wherein the memory device comprising a control bus and a memory unit connected to the control bus, the memory unit comprising a control circuit and a computation circuit;
wherein the computation circuit comprises a first resistive random access memory (RRAM) crossbar having multiple rows and multiple columns of memory cells, multiple word lines connected to respective rows of memory cells, and a plurality of comparator circuits each connected to a corresponding column of the first RRAM crossbar array, wherein the comparator circuits are set to have incremental thresholds;
wherein the control circuit is connected to the control bus and configured to:
receive the computation instruction for performing a vector multiplication of vector A and vector B;
setting the memory cells in the first RRAM crossbar array such that states of memory cells of each column of the first RRAM crossbar array correspond to elements of vector B;
setting the word lines of the first RRAM crossbar array according to elements of vector A;

wherein the outputs of the comparator circuits are voltage signals corresponding to a first binary number in which a number of bits with a value 1 indicates a numerical result of multiplication of vector A and vector B.

18. The computing device according to claim 17, wherein the computation circuit further comprises a second RRAM crossbar array and a third RRAM crossbar array each having multiple rows and multiple columns of memory cells and multiple word lines connected to respective rows of memory cells, wherein outputs of the comparator circuits are connected to corresponding word lines of the second RRAM crossbar array, outputs of the second RRAM crossbar array are connected to corresponding words lines of the third RRAM crossbar array, wherein the second RRAM crossbar array being set up to convert the outputs of the comparator circuits into an output representing an intermediate binary number in which a location of a bit with a value 1 indicates the numerical result of multiplication of vector A and vector B; and the third RRAM crossbar array being set up to convert the output of the second RRAM crossbar array into an output representing a second binary number having a numerical value equal to the numerical result of multiplication of vector A and vector B.

19. The computing device according to claim 18, wherein the multiple rows and multiple columns of memory cells in the first RRAM crossbar array comprise N rows x N columns resistors, an input end of a resistor in each row at the first RRAM crossbar array is connected to a word line, an output end of a resistor in each column at the first RRAM crossbar array is connected to a bit line, N word lines of the first RRAM crossbar array are connected to the control circuit, and each of N bit lines of the first RRAM crossbar array are respectively connected to a comparator circuit of the plurality of comparator circuits;

the first RRAM crossbar array generates N current signals on the N bit lines according to voltage signals input by the N word lines and a resistance value of a resistor at the first RRAM crossbar array, a voltage value of a voltage signal input by the $j^{th}$ word line in the N word lines is a voltage value corresponding to $B_j$, a resistance value of a resistor in the $j^{th}$ row at the first RRAM crossbar array is a resistance value corresponding to $A_j$, $B_j$ is the $j^{th}$ element of vector B, $A_j$ is the $j^{th}$ element of vector A, and a value of j ranges from 0 to N−1, wherein each of vector A and vector B indicates an N-dimensional vector, each elements of vector A and vector B indicates a value 1 or 0, and N is a positive integer not less than 2;

the N comparator circuits respectively convert the N current signals into N voltage signals, and compare the N voltage signals with voltage thresholds respectively corresponding to the N comparator circuits, to output, from output ends of the N comparator circuits, the voltage signals corresponding to the first binary number, wherein the first binary number is an N-dimensional vector, first K elements of the first binary number are 1, remaining elements are 0, and K is the result of multiplication of vector A and vector B;

the second RRAM crossbar array comprises a (2N−1) rows×N columns resistor array, an input end of a resistor in each row at the second RRAM crossbar array is connected to a word line, an output end of a resistor in each column at the second RRAM crossbar array is connected to a bit line, and each of word lines of the second RRAM crossbar array is connected to a output end of a comparator circuit in the first RRAM crossbar array;

the second RRAM crossbar array receives the voltage signals corresponding to the first binary number from the output ends of the comparator circuits of the first RRAM crossbar array through the 2N−1 word lines, and performs a logic operation according to the voltage signals corresponding to the first binary number and a resistance value of a resistor at the second RRAM crossbar array:

$$\overline{O}_{2,j} = \begin{cases} \overline{O}_{1,j} + O_{1,j+1}, & j < N-1 \\ \overline{O}_{1,j}, & j = N-1 \end{cases}$$

to obtain voltage signals corresponding to an intermediate binary number, wherein $\overline{O}_{1,j}$ is a negation of a value corresponding to a voltage signal output by a comparator circuit connected to the $j^{th}$ bit line of the first RRAM crossbar array, $O_{1,j+1}$ is a value corresponding to a voltage signal output by a comparator circuit connected to the $(j+1)^{th}$ bit line of the first RRAM crossbar array, and $\overline{O}_{2,j}$ is a negation of a value corresponding to a voltage signal output by the $j^{th}$ bit line of the second RRAM crossbar array;

the third RRAM crossbar array comprises an N rows×n columns resistor array, an input end of a resistor in each row at the third RRAM crossbar array is connected to a word line, an output end of a resistor in each column at the third RRAM crossbar array is connected to a bit line, and n is greater than or equal to a minimum quantity of bits required for expressing the integer N in binary; and the third RRAM crossbar array receives voltage signals corresponding to the intermediate binary number from N bit lines of the second RRAM crossbar array through N word lines of the third RRAM crossbar array, and encodes the intermediate binary number according to the voltage signals corresponding to the intermediate binary number and resistance values of resistors at the third RRAM crossbar array to obtain voltage signals corresponding to the second binary number.

20. The computing device according to claim 19, wherein the $j^{th}$ comparator circuit in the N comparator circuits comprises a resistor $R_s$ of a constant resistance value and a comparator, one end of the resistor $R_s$ is connected to the $j^{th}$ bit line in the N bit lines and the comparator, the other end of the resistor $R_s$ is grounded, a voltage threshold of the $j^{th}$ comparator circuit is $V_r * g_{on} * R_s * (2j+1)/2$, $V_r$ indicates a voltage value corresponding to a value 1, and $g_{on}$ indicates a reciprocal of $R_{on}$.

* * * * *